(12) United States Patent
Agreda de Ro et al.

(10) Patent No.: US 8,894,427 B2
(45) Date of Patent: Nov. 25, 2014

(54) USB DEVICE WITH A CAP

(71) Applicant: Vasco Data Security, Inc., Oakbrook Terrace, IL (US)

(72) Inventors: Maya Agreda de Ro, Berchem (BE); Rudy Waltniel, Denderleeuw (BE)

(73) Assignee: Vasco Data Security, Inc., Oakbrook Terrace, IL (US)

( * ) Notice: Subject to any disclaimer, the term of this patent is extended or adjusted under 35 U.S.C. 154(b) by 147 days.

(21) Appl. No.: 13/728,136

(22) Filed: Dec. 27, 2012

(65) Prior Publication Data

US 2013/0171846 A1    Jul. 4, 2013

Related U.S. Application Data

(60) Provisional application No. 61/581,737, filed on Dec. 30, 2011.

(51) Int. Cl.
*H01R 13/44* (2006.01)
*G06K 19/077* (2006.01)
*H01R 13/447* (2006.01)
*H05K 5/02* (2006.01)

(52) U.S. Cl.
CPC .......... *H01R 13/44* (2013.01); *G06K 19/07732* (2013.01); *H01R 13/447* (2013.01); *H05K 5/0278* (2013.01)
USPC .......................................... 439/142; 439/707

(58) Field of Classification Search
CPC .............................. H01R 13/44; H01R 13/453
USPC ................. 439/142, 144, 702, 707, 750
See application file for complete search history.

(56) References Cited

U.S. PATENT DOCUMENTS

| | | | | |
|---|---|---|---|---|
| 3,428,936 | A * | 2/1969 | Arnao, Jr. | 439/144 |
| 4,576,428 | A * | 3/1986 | DeLuca et al. | 439/271 |
| 4,917,627 | A * | 4/1990 | Hendricks | 439/371 |
| 7,361,047 | B2 * | 4/2008 | Strahl | 439/354 |
| 7,503,780 | B1 | 3/2009 | Huang | |
| 7,540,756 | B1 * | 6/2009 | Strahl | 439/354 |
| 7,708,581 | B2 * | 5/2010 | Weiss | 439/344 |
| 7,740,495 | B1 * | 6/2010 | Lo | 439/142 |
| 7,862,384 | B2 * | 1/2011 | Myers | 439/638 |

(Continued)

OTHER PUBLICATIONS

International Search Report, dated Jul. 22, 2013, corresponding to International Application No. PCT/US2012/071939, filed Dec. 28, 2012.

(Continued)

*Primary Examiner* — James Harvey
(74) *Attorney, Agent, or Firm* — RatnerPrestia

(57) ABSTRACT

An electronic device, which may be a USB device, includes a body part that is removably connected to a cap. The body part includes a connector for plugging the device into a host computing device. The cap includes a lever part and a main part. The lever part of the cap is attached to the main part and pivots at least partially around a pivot axis. The lever part includes an anchor part on one side of the pivot axis and an unlock part on the other side of the pivot axis. The anchor part includes a hook that engages a cavity in the body part when the cap is connected to the body part. Depressing the unlock part of the cap causes the lever to pivot around the pivot axis thereby disengaging the hook from the first cavity, and thereby releasing the cap from the body part.

15 Claims, 14 Drawing Sheets

(56) References Cited

U.S. PATENT DOCUMENTS

| | | |
|---|---|---|
| 8,251,719 B1 * | 8/2012 | Pan et al. .................. 439/142 |
| 8,500,468 B2 * | 8/2013 | Gravolin et al. ............ 439/144 |
| 2007/0111583 A1 | 5/2007 | Cuellar et al. |
| 2008/0192444 A1 | 8/2008 | Chen |
| 2009/0253305 A1 * | 10/2009 | Weiss ........................ 439/638 |
| 2009/0258516 A1 | 10/2009 | Hiew et al. |
| 2012/0129386 A1 * | 5/2012 | Sun ........................... 439/540.1 |
| 2013/0171846 A1 * | 7/2013 | Agreda de Ro et al. ...... 439/136 |

OTHER PUBLICATIONS

Translation of Chinese First Notification to Make Rectification, dated Apr. 26, 2013, corresponding to Chinese Patent Application No. 201220736629.9.

* cited by examiner

USB DEVICE WITH A CAP

CROSS-REFERENCE TO RELATED APPLICATIONS

This patent application claims priority to U.S. Provisional Patent Application No. 61/581,737, filed Dec. 30, 2011, which is incorporated by reference herein in its entirety.

FIELD OF THE INVENTION

The invention relates to a Universal Serial Bus (USB) device having a cap to protect the USB connector and more particular to a technique to fasten the cap to the device's body that ensures that when the cap is put on the USB device that there is a very low probability of unintentional detachment of the cap while still allowing the user to remove the cap in an easy and convenient way.

BACKGROUND OF THE INVENTION

Since the arrival on the market of the USB (Universal Serial Bus) standard to connect computers and all kinds of peripheral devices, more and more electronic devices that are meant to interact with computers are given the form factor of USB sticks, i.e., a highly portable somewhat flattened and elongated shape with a USB connector at one end such that the device can be easily carried around and can be easily plugged into a USB connector of a host computer. Examples of such USB devices include USB memory sticks, USB authentication tokens, wireless modems with a USB connector, MP3 players with a USB connector, and so forth.

USB devices with the form factor of a USB stick often come with a cap that can be plugged on the device's body to hide and protect the USB connector. These caps offer a number of advantages. On the one hand such a cap protects a USB device's USB connector from external influences (such as dirt or splash water or scratching metal objects such as keys) that could damage the connector or could be detrimental to the correct functioning of the connector. On the other hand such a cap protects the textile of a user's clothing against the wear and tear that the contact with the hard and relatively sharp metal edges of the USB connector might cause when the USB device is carried in a user's pockets.

The mechanism that ensures that a cap remains attached to a USB device's body when that cap is plugged on the body to protect the device's USB connector should satisfy a number of requirements. Two of these requirements are not obvious to reconcile. On the one hand when the cap is plugged on the device's body it should hold to the device firmly enough to minimize the likelihood that the cap is unintentionally detached, even if the cap and device are submitted to forces that would tend to pull them apart (for example the force of gravity in case the user is carrying the device hanging on a lanyard that is attached to either the device's body or the device's cap). On the other hand it should be easy enough for a user to pull off the cap from the device without having to carry out complicated or time-consuming actions or having to exert an uncomfortable level of force. Another requirement is that the cap's attachment mechanism should remain effective even when the cap has been plugged on and off many times.

One solution is to tune the dimensions of the device's body and the cap such that at the contact area between the cap and the device's body when the cap is plugged on the body, the cap is slightly smaller or narrower than the body, which, in combination with a certain elasticity of cap and/or body, results in a pressure force between cap and body at the contact area. By ensuring that the contact area is more or less parallel to the axis along which the cap is plugged onto the body, the friction force which results from the pressure force and which is parallel to the contact area will counteract forces that would tend to pull off the cap. This solution, while popular, has however a number of disadvantages. The dimensions of the cap and the body should be finely tuned to each other within narrow margins. If the cap is too wide with respect to the body it will not sufficiently hold on to the body when plugged on. Conversely, if the cap is too narrow with respect to the body, the user may have to exert excessive force to plug the cap on or to pull it off. Ensuring this narrow fine tuning of the dimensions of cap and body may sometimes be problematic. This is in particular true for USB devices consisting of a substrate onto which the device's electronics have been arranged, enclosed in a combination of two (or more) shells which are attached to each other, and a protruding USB connector that comes out of the enclosure. Often the device's Printed Circuit Board (PCB) with electronic components is housed inside a housing which consists of two shells that are placed each on one side of the PCB with the direction of mounting the shells being perpendicular to the plane of the PCB so that the shells can fix the PCB well. Depending on the technique to attach these shells, fine tuning the exact dimension of the resulting enclosure within narrow margins can be difficult or even impossible. For example, a popular technique to manufacture a plastic housing for USB tokens is to ultrasonically weld together an upper and a lower plastic shell. Ultrasonic welding is an interesting technology for assembling security devices such as USB tokens since it can be difficult to open an ultrasonically welded device without damaging the housing and leaving visible traces. This contributes to the tamper evidence of the device. However, it can be difficult to control the process of ultrasonic welding to a sufficient degree to ensure that the overall thickness of the resulting housing can be defined within a sufficiently narrow margin. With ultrasonic welding, the resulting position of the two shells relative to each other can typically vary with as much as 0.25 mm. Another disadvantage is that the wear and tear of repeatedly plugging and removing the cap may eventually cause some deformation of the cap and/or the device's body such that the connection between cap and body eventually becomes looser so that the fastening of the cap to the body becomes less reliable.

Another solution to removably fasten a cap to the body of a USB device is to provide both cap and device with a compatible screw thread and screw the cap on the body. This solution has however the following disadvantages. This solution may require that the cap and the body have a cylindrical form (at least at the contact area) while most USB devices tend to be considerably broader than thick (for example to be as compact as possible while still remaining compliant with the USB specification). Also the action of screwing the cap on or off the body may be perceived by users as being too time-consuming in comparison to just simply plugging a cap on the device's body or pulling it off the device's body.

What is therefore needed is a mechanism to fasten a cap to the body of a USB device that does not have the disadvantages of the solutions described above.

SUMMARY OF THE INVENTION

The following presents a simplified summary of the present invention in order to provide a basic understanding of some aspects described herein. This summary is not an extensive overview of the claimed subject matter. It is intended to neither identify key or critical elements of the claimed subject matter nor delineate the scope of the invention. Its sole purpose is to present some concepts of the claimed subject matter in a simplified form as a prelude to the more detailed description that is presented later.

Some embodiments according to aspects of the invention include an apparatus comprising a cap and a body part whereby the cap can be removably fastened to the body part. In typical embodiments the mechanism for fastening the cap and the body part is meant to allow the user to repeatedly and conveniently fasten and unfasten the cap and the body part. The cap may comprise a first part and a second part. The cap's first part will be further referred to as the cap's main part and the cap's second part will be further referred to as the cap's lever part. The cap's lever part may further occasionally also be referred to as the cap's locking part. The cap's lever part is fixed to the cap's main part by means of a number of connections at a number of fixation points. In some embodiments the cap's lever part can pivot to some degree around a pivot axis. In some embodiments this pivot axis is going through at least one fixation point. In some embodiments the lever part is fixed to the main part by means of two fixation points and the lever part can pivot around a pivot axis going through these two fixation points. In some embodiments the cap has a mechanism to exert restoring torsion on the lever when the lever is pivoted around the pivot axis. In some embodiments this restoring mechanism may comprise one or more springs which may include one or more torsion springs. In some embodiments the cap's lever part and the cap's main part are connected by two rigid but elastic relatively narrow bridges (e.g., made of metal or plastic) such that when the lever is made to pivot around a pivot axis through these connecting bridges, the connections will be twisted and experience an elastic deformation which results in a restoring torsion. In some embodiments the cap's lever part and the cap's main part are connected by two rigid but elastic relatively narrow bridges (e.g., made of metal or plastic) such that when the lever is made to pivot around a pivot axis that is more or less parallel to an axis through these connecting bridges, the connections will experience an elastic deformation (e.g. lengthening) which may result in a restoring torsion with respect to the pivot axis.

The cap's lever has two subparts. The first subpart of the lever consists of the part of the lever part that is located at one side of the pivot axis. The second subpart of the lever consists of the part of the lever that is located at the other side of the pivot. One subpart of the lever may have a protrusion that protrudes towards the inside, i.e., towards the device's body, when the cap is plugged on the device's body. This subpart will be further referred to as the anchor part. The protrusion of the anchor will be further referred to as the hook. The other subpart of the cap's locking part will be further referred to as the unlock part. In some embodiments the device's body part has a cavity that matches the hook such that when the cap is plugged on the device's body the cap's hook fits into the body's cavity.

When a pulling force is exerted on the cap to pull the cap off the body, the hook will come into contact with a wall of the cavity which prevents further movement of the cap thus effectively locking the cap into position. The hook's locking the cap to the device's body can counteract pulling forces that are much higher than pulling forces that can be withstood by traditional solutions that are based on friction forces. To unlock the cap the user pushes on the unlock part of the cap's locking part pushing the unlock part towards the inside. The cap's lever part acts as a seesaw and pivots around the pivot axis which in some embodiments may coincide with or be parallel to an axis going through the fixation points that fix the cap's lever part to the cap's main part. As a result the cap's anchor part moves outward lifting the anchor's hook out of the body's cavity. Once the hook is lifted fully out of the cavity, the hook will no longer make contact with the cavity's walls when the cap is being pulled off the device's body, thus effectively unlocking the cap so that the user can effortlessly pull the cap off the device's body.

If the lever is rotated too far, there may be a risk of a non-elastic deformation of some parts of the cap, especially of the connections of the lever with the main part. In some embodiments the lever's degree of freedom to rotate is limited by the presence of the device's body in the cap. When the user pushes on the unlock part and the unlock part moves inwards, the unlock part will at some point come into contact with the device's body which will halt further rotation. This may ensure that the user will not inadvertently rotate the lever too far beyond a point where the lever and/or the connections of the lever with the cap's main part may be permanently deformed. In some embodiments the cap and the device's body are shaped so that the lever can rotate around the pivot axis with the anchor rotating outward and the unlock part moving inward, whereby the lever can rotate sufficiently far for the hook to move sufficiently outwards to unlock the cap and whereby at some point further rotation will be inhibited by the unlock part being blocked by the presence of the device's body to prevent certain parts, like for example the connections between the lever and the cap's main part, from being permanently deformed due to excessive rotation of the lever.

It will be clear to a person skilled in the art that in an equivalent embodiment the hook is located on the device's body and the anchor part of the lever of the cap has a cavity in which the hook of the device's body fits when the cap is plugged on the device's body. The rest of the description is, mutatis mutandis, equally valid for this equivalent embodiment. Without lack of generality, the description will continue assuming that the hook is located on the cap's anchor and the corresponding cavity is located on the device's body.

In what follows the direction of movement when the cap is plugged on the device's cap will be referred to as the plugging direction, and the direction that is perpendicular to both the plugging direction and the direction parallel to the lever's pivot axis will be referred to as the vertical direction.

In many embodiments the device has an elongate shape. In some embodiments the direction of maximal size of the device is parallel to the plugging axis. In some embodiments the device has a longitudinal axis. In some embodiments the longitudinal axis is parallel to the plugging direction (for example, to be compliant with the USB specification). In many embodiments the device is somewhat flattened. In some embodiments the device is broader in the direction parallel to the lever's pivot axis than in the vertical direction. In some embodiments the width of the device's body is essentially determined by the width of a USB connector while the thickness or height of the device's body is determined by the thickness of the PCB and the vertical dimensions of the electronic components on both sides of the PCB.

In some embodiments the device has dimensions and weight which make it easy and convenient for a user to carry the device in the user's pockets. In some embodiments the device is key-sized which in the context of this application means that the device has dimensions and weight which make it comparable to a car key or typical USB memory sticks i.e. a key-sized embodiment has a weight that preferably does not exceed 75 grams, a volume that preferably does not exceed 35 cubic centimeters, a maximum length in one direction that preferably does not exceed 10 centimeters. In some embodiments the body part of the apparatus is longitudinal, having the connector at one end and having dimensions in any direction perpendicular to the axis of plugging the connector into a host computer that does not exceed the size of the connector in that direction by more than 0.5 centimeter or by more than a factor of two.

In some embodiments the body part comprises a plurality of shells that are joined together. In some embodiments two or more shells are joined by means of ultrasonic welding. In some embodiments two or more shells are joined by gluing, screwing, traditional welding, snap-fit joining or some other joining technique.

In some embodiments the body part of the device comprises provisions, such as a ring or a hole, to attach the device to, for example, a key ring, a chain or a lanyard. In some embodiments the cap of the device comprises provisions, such as a ring or a hole, to attach the device to, for example, a key ring, a chain or a lanyard.

Gentle Slope of Hook and/or Body to Allow Smooth Effortless Plugging-on of the Cap.

In many embodiments the contact surface between the cap's hook and the device's body during the plugging-on of the device makes an angle with the plugging direction which is substantially less than 90 degrees. As a consequence, the component of the reactive force that the device's body exerts on the cap's hook that is parallel to the plugging axis (and which counteracts the plugging of the cap on the device) is relatively small, and the component of the reactive force that is parallel to the vertical axis is relatively high. This contributes to allowing a smooth effortless plugging-on of the cap. In some embodiments the side of the cap's hook that faces the device's body when the cap is being plugged on has a gentle slope with respect to the plugging direction. In some embodiments the angle of this slope is less than 30 degrees. In some embodiments the area of the device's body that comes in contact with the cap's hook when the cap is being plugged on has a gentle slope with respect to the plugging direction. In some embodiments the angle of this slope is less than 30 degrees.

Helper Hook on Opposite Side with Sloping Edges.

In some embodiments the cap has a second protrusion on the cap's interior, which from the point of view of the lever is on the other side of the cap with respect to the device's body. This second protrusion is directed towards the device's body. When the cap is plugged on the device's body, this second protrusion fits in a corresponding second cavity of the device's body. This second protrusion and second cavity have a shape and dimensions that when a force is exerted that would tend to pull off the cap, at least in certain circumstances, the second protrusion will come into contact with a wall of the second contact thus exerting a force that will counteract the force that tends to pull off the cap. It will be clear to a person skilled in the art that in an equivalent embodiment this second protrusion is located on the device's body and the cap has a corresponding cavity in which this second protrusion of the device's body fits when the cap is plugged on the device's body. The rest of the description is, mutatis mutandis, equally valid for this equivalent embodiment. Without lack of generality, the description will continue assuming that the second protrusion is located on the cap and the corresponding cavity is located on the device's body. In some embodiments the device's body may, in the vertical direction, be narrower than the cap and have some degree of freedom to move in a direction more or less parallel to the vertical direction. This may, for example, be the case for devices whereby the device's body comprises shells that have been ultrasonically welded together. In such cases the cap could move in a direction away from the lever's hook thereby making the hook's grip on the device's body less reliable. However, in these cases the device's body will move towards the second protrusion making the second protrusion lock the device's body or making it lock more firmly thus compensating (at least partially) for the diminished locking of the lever's hook. Another effect of this degree of freedom due to the device's body being somewhat narrower in the vertical direction than the cap is that the hook may act as a pivot point around which the cap may turn to some extent. This could give the user the impression that the cap is not well fixed to the device's body. In such cases the second protrusion may counteract this turning. Yet another advantageous effect of the second protrusion is that it may give the user a 'click' feedback (which may be of an auditory and/or tactile nature) indicating that the cap is plugged well in position on the device's body. In some embodiments one or both of the sides of the second protrusion towards or away from the plugging direction make an angle with respect to the vertical direction so as to ease plugging on and pulling off of the cap. In other embodiments one or both of these sides may be more or less parallel to the vertical direction. In some embodiments the wall of the body's second cavity in the plugging direction which may enter into contact with the second protrusion when the cap is being pulled off may have a slope that forms an angle with the vertical direction so to ease the pulling off of the cap. In other embodiments this wall may be more or less parallel to the vertical direction.

Guiding Ridge-Groove System to Position the Cap with Respect to the Body's Shell that Also Contains the Cavity that Matches the Cap's Hook.

In some embodiments the cap's main part has a ridge (respectively a groove) and the device's body part has a corresponding groove (respectively ridge) with matching dimensions. The ridge and the matching groove are parallel to the direction of movement when the cap is plugged on or pulled off the device's body and are located such that when the cap is plugged on the device, the ridge fits into the groove so that vertical movement of the cap, i.e. movement perpendicular to the axis along which the cap is plugged on the device's body, is effectively prohibited. In some embodiments the housing of the device's body comprises two or more shells and a first shell that holds the cavity corresponding to the cap's hook also holds the groove (respectively ridge) that corresponds to the cap's ridge (respectively groove). As a result the positioning of the cap with respect to the device's body is fully determined by that first shell so that the requirements regarding the exact positioning of the other shells with respect to the first shell when the shells are being joined during manufacturing can be significantly relaxed.

Ridge that Acts as Fulcrum.

In some embodiments there is a point or an area on the cap's lever near the lever's pivot axis where the cap (when it is plugged on the device's body) and the device's body are in contact or come into contact when the user presses the lever's unlock part. The parts of the cap and the device's body around this contact area are formed such that these surrounding parts of the cap and the device's body are not in contact. Since the contact area is near the lever's pivot axis, the contact area effectively acts as a fulcrum. In some embodiments the contacting parts of the cap's lever and the device's body comprise a protrusion on at least the cap's lever or the device's body. In some embodiments this protrusion comprises a ridge. In some embodiments this ridge is parallel to the lever's pivot axis. In some embodiments the lever has a ridge on the inside of the cap near the lever's pivot axis (for example, a ridge just under the pivot axis) that when the cap is put on the device's body is in contact or enters into contact with the device's body when the user presses the lever's unlock part such that it acts as a fulcrum for the lever when the user presses the lever's unlock part. In some embodiments the device's body has a ridge that is located such that when the cap is put on the device's body this ridge is very near the lever's pivot axis and that it is in contact or enters into contact with the cap near the lever's pivot axis when the user presses the lever's unlock part such that it acts as a fulcrum for the lever when the user presses the lever's unlock part.

In some embodiments, as seen from the perspective of the hook, the fulcrum, which may take the form of a ridge, is located slightly beyond the pivot axis (for example, two millimeters). In some embodiments the cap and the device's body are shaped and dimensioned such that when the cap is plugged on the device's body, the fulcrum ridge is in contact with the device's body and the device's body exerts a certain force on the fulcrum. Since the fulcrum is slightly off axis with respect to the pivot axis and located to the other side of the pivot axis with respect to the hook, this force tends to push the hook towards the device's body thus enhancing the reliability of the locking effect of the hook.

Membrane Bridging the Gap Between the Lever and the Main Part of the Cap.

In some embodiments the gap between the lever and the main part of the cap may be bridged, entirely or partially, by a membrane like structure. This membrane like structure may be elastic so as to allow the lever to pivot at least to some degree around the pivot axis. In some embodiments the membrane like structure comprises a thin layer of plastic connecting the main part of the cap with the lever. The membrane like structure may serve in some embodiments to improve the protecting nature of the cap against e.g. splashing water.

Connector to Connect the Device to a Host Computer.

In some embodiments the apparatus comprises an electronic device. In some embodiments the electronic device comprises a connector to connect the electronic device to a host computing device like, for example, a Personal Computer (PC), a laptop or a tablet computer. In some embodiments this connector is adapted to establish an electrical connection between the electronic device and the host computing device. In some embodiments the connector is for conveying electronic signals between the electronic device and the host computing device. In some embodiments the connector is for electronically exchanging data between the electronic device and the host computing device. In some embodiments the mechanical aspects of the connector are specified in a technical industry standard. In some embodiments the electrical aspects of the signals conveyed over the connector are specified in a technical industry standard. In some embodiments certain aspects of the protocol to exchange data over the connector are specified in a technical industry standard. In some embodiments the connector comprises a USB connector. In some embodiments the connector may comprise a 4-circuit or 6-circuit FireWire 400 alpha connector. In some embodiments the electronic device supports a plug-and-play capability when being connected to a host computer. In some embodiments the cap is plugged on the device's body to protect the connector. In some embodiments the direction of movement when plugging the device's connector into a host computing device is parallel to the direction of movement when plugging the cap on the device's body. In some embodiments the longitudinal axis of the connector is parallel to the longitudinal axis of the device's body.

In some embodiments the cap plugs onto the connector itself. In some embodiments the cavity of the device's body for the lever's hook to fit into when the cap is plugged on the connector is an integral part of the connector itself. In some embodiments the dimensions of the cavity of the device's body for the lever's hook to fit into when the cap is plugged on the connector is described in a standard describing the mechanical aspects of the connector.

In some embodiments the body part of the electronic device includes electronic components that are laid out on a substrate. In some embodiments this substrate includes a PCB (Printed Circuit Board). In some embodiments the electronic connector is affixed to the substrate and electrically connected to at least one of the electronic components laid out on the substrate. In some embodiments the electronic components laid out on the substrate comprise a data processing component. In some embodiments the data processing component comprises a processor or microcontroller. In some embodiments the data processing component includes an ASIC (Application Specific Integrated Circuit). In some embodiments the data processing component includes an FPGA (Field Programmable Gate Array). In some embodiments the data processing component includes an ARM processor. In a particular embodiment the data processing component includes an Atmel AT32UC3A3 processor In some embodiments this data processing component is adapted to handle a communication protocol to communicate with a host computing device. In some embodiments this communication protocol comprises the USB protocol.

In some embodiments the body part of the electronic device comprises a memory component for storing data. In some embodiments the memory component includes a solid state memory chip. In another embodiment the memory component includes a flash memory. In some embodiments the memory component includes a NAND flash integrated circuit. In some embodiments the memory component includes a NOR flash integrated circuit. In some embodiments the memory component includes a memory card. In some embodiments the memory component includes an SD (Secure Digital) card. In other embodiments the memory component includes a CompactFlash card. In still other embodiments the memory component includes an MMC (MultiMediaCard) card. Other memory technologies may also be used such as: electrically erasable programmable read-only memory (EEPROM), programmable metallization cell (PMC), conductive-bridging RAM (CBRAM), Ferroelectric RAM (FeRAM or FRAM), Magnetoresistive Random Access Memory (MRAM), Phase-change memory (also known as PCM, PRAM, PCRAM, Ovonic Unified Memory, Chalcogenide RAM and C-RAM), or others. In some embodiments the electronic device presents itself to a host computing device as a mass storage device when the electronic device is connected to the host computing device. In some embodiments the electronic device comprises a memory stick.

In some embodiments the body part of the electronic device includes a non-volatile memory component to securely store secrets such as one or more cryptographic keys or seed values and/or other confidential or security sensitive data such as one or more PIN or password values or biometric reference values. In other embodiments the body part of the electronic device has one or more active or passive security mechanisms to protect against unauthorized access to sensitive or confidential data and/or to protect against unauthorized attempts to alter the value of certain security related data elements such as PINs, passwords or biometric reference data, or PIN Try Counters or security settings. In some embodiments the body part of the electronic device includes a smart card or smart card chip. The smart card chip may be a chip as used for smart cards adhering to the ISO/IEC 7816 specifications. In some embodiments the body part of the electronic device includes a smart card chip that is fixedly integrated into the body part of the electronic device. In other embodiments the body part of the electronic device includes a removable smart card, e.g., of the ID-000 format (as used for SIM cards), but also other formats such as the ID-1 format may be used. Examples of smart cards or smart card chips that may be used include: the Oberthur ID-One Smart Card Chip, Siemens CardOS, G&D StarCOS, or others. In some embodiments the electronic device is adapted to handle a smart card reader protocol to exchange smart card commands with the host computer. In some embodiments the electronic device is adapted to support the USB CCID (Integrated Circuit(s) Cards Interface Device) protocol (see also 'Universal Serial Bus—Device Class: Smart Card—CCID—Specification for Integrated Circuit(s) Cards Interface Devices—revision 1.1, Apr. 22, 2005', http://en.wikipedia.org/wiki/Integrated_Circuit_Card_Interface_Device, incorporated herein by reference). In some embodiments the electronic device may support another protocol to exchange smart card commands with the host computer.

In some embodiments the body part of the electronic device comprises a processor that is adapted to perform cryptographic operations. In some embodiments the body part of the electronic device comprises a processor that is adapted to generate authentication credentials. In some embodiments the body part of the electronic device comprises a processor that is adapted to generate electronic signatures. In some embodiments the body part of the electronic device comprises a processor that is adapted to perform asymmetric cryptographic operations to generate electronic signatures or authentication credentials. In some embodiments the body part of the electronic device comprises a smart card or smart card chip. The smart card chip may be a chip as used for smart cards adhering to the ISO/IEC 7816 specifications. In some embodiments the body part of the electronic device comprises a removable smart card, such as the ID-000 format (as used for SIM cards), but other formats such as the ID-1 format may be used. Examples of smart cards or smart card chips that may be used include: the Oberthur ID-One Smart Card Chip, Siemens CardOS, G&D StarCOS, chips from the Infineon SLE66 family, or others. In some embodiments the smart card or smart card chip may be adapted to perform cryptographic operations. In some embodiments the smart card or smart card chip may be adapted to perform asymmetric cryptographic operations to generate electronic signatures or authentication credentials. In some embodiments the electronic device may comprise a USB authentication token.

In some embodiments the electronic device comprises a user output interface for the device to output information to a user. In some embodiments the user output interface may comprise a display. In some embodiments the display may comprise a LCD (Liquid Crystal Display). In some embodiments the user output interface may comprise a LED (Light Emitting Diode). In some embodiments the electronic device comprises a user input interface for a user to provide information to the device. In some embodiments the information provided by the user may comprise a PIN code. In some embodiments the information provided may comprise an approval for an operation to be carried out by the device. In some embodiments the user input interface may comprise one or more push buttons.

In some embodiments, when the electronic device is connected to a host computer, it relies on the host computer to provide its power supply. In some embodiments the connector includes a galvanic connection for the host computer to supply power to the electronic device. In some embodiments the electronic device has no autonomous power supply. In some embodiments the electronic device has an autonomous power supply to supply power to the device when it is not connected to a host computer. In some embodiments this autonomous power supply may include a battery.

In many embodiments the cap is in its entirety produced from a single type of material. In some embodiments the cap is made of one single piece of material. In some embodiments the cap does not comprise any detachable parts. In some embodiments the cap is produced as one single monolithic item. In some embodiments no assembly of subparts is required to manufacture the cap. This may add to the cost effectiveness of the invention. In some embodiments the cap is composed of plastic. In some embodiments the cap is manufactured using an injection moulding process. In some embodiments the cap is composed of metal. In some embodiments the cap is manufactured using a casting process.

Some embodiments according to aspects of the invention include an electronic device comprising a body part and a cap that is removably connected to the body part, the body part comprising a connector for plugging the device into a host computing device, said connector being concealed by the cap when the cap is connected to the body part, the cap comprising a lever part and a main part, the lever part of the cap being attached to the main part, the lever part being able to pivot at least partially around a pivot axis with respect to the main part, the lever part comprising an anchor part on one side of the pivot axis and an unlock part on the other side of the pivot axis, the anchor part of the cap comprising one of a first hook and a first cavity, the body part comprising the other of the first hook and the first cavity, said first cavity for receiving the first hook when the cap is plugged on the body part of the device, the first hook being configured to lock the cap onto the body part of the device when the first hook is positioned in the first cavity, the unlock part being configured to be depressed by a user of the device to cause the lever to pivot around the pivot axis thereby disengaging the first hook from the first cavity so that the cap can be released from the body part of the device.

In some embodiments the electronic device further comprises a fulcrum extending from a surface of either the cap or the body part about which the lever part is configured to pivot. In some embodiments a longitudinal axis of the fulcrum is spaced by a predetermined distance from a pivot axis of the lever part. In some embodiments the anchor part of the cap comprises the first hook and the fulcrum is positioned on an opposite side of the pivot axis as the first hook, wherein, upon mounting the cap to the body part, the fulcrum contacts the body part which causes the first hook to pivot into the first cavity.

In some embodiments the electronic device further comprises one of a second hook and a second cavity positioned on the main part of the cap, the body part comprising the other of the second hook and the second cavity, said second cavity for receiving the second hook when the cap is plugged on the body part of the device, the second hook being configured to lock the cap onto the body part of the device when the second hook is positioned in the second cavity.

In some embodiments the electronic device further comprises a first alignment element defined on a surface of one of the cap and the body part, and a second alignment element defined on a surface of the other of the cap and the body part, said alignment elements being configured to operate together for aligning the cap with the body part upon mating the cap with the body part. In some embodiments the body part comprises a plurality of shell parts that are joined together, and wherein the alignment element that is defined on the body part resides on the same shell part of the body part as the other of the first hook and the first cavity that is comprised on the body part. In some embodiments at least two shell parts have been joined by ultrasonic welding. In some embodiments the first alignment element is a protruding ridge and the second alignment element is a groove that is configured to receive the protruding ridge. In some embodiments the first and second alignment elements are configured to operate together, when the cap is plugged onto the body part, to restrict the movement of the cap with respect to the body part along a direction perpendicular to the lever's pivot axis. In some embodiments the first and second alignment elements are configured to operate together, when the cap is plugged onto the body part, to restrict the movement of the cap with respect to the body part along a direction perpendicular to the direction of movement when the cap is being plugged onto the device's body part. In some embodiments the first and second alignment elements are configured to operate together, when the cap is plugged onto the body part, to restrict the movement of the cap with respect to the body part along a direction that is perpendicular to both the lever's pivot axis and the direction of movement when the cap is being plugged onto the device's body part.

In some embodiments the connector of the body part of the electronic device comprises a USB connector. In some embodiments the first cavity is located on the USB connector.

In some embodiments a gap is defined between the lever part and the main part of the cap of the electronic device, and an elastic membrane is positioned in a portion of the gap.

Some embodiments according to aspects of the invention include a USB device comprising a body part and a cap that is removably connected to the body part, the body part comprising a USB connector for plugging the device into a host computing device, said connector being concealed by the cap when the cap is connected to the body part, the cap comprising a lever part and a main part, the lever part of the cap being attached to the main part, the lever part being able to pivot at least partially around a pivot axis with respect to the main part, the lever part comprising an anchor part on one side of the pivot axis and an unlock part on the other side of the pivot axis, the anchor part of the cap comprising one of a first hook and a first cavity, the body part comprising the other of the first hook and the first cavity, said first cavity for receiving the first hook when the cap is plugged on the body part of the device, the first hook being configured to lock the cap onto the body part of the device when the first hook is positioned in the first cavity, the unlock part being configured to be depressed by a user of the device to cause the lever to pivot around the pivot axis thereby disengaging the first hook from the first cavity so that the cap can be released from the body part of the device; a fulcrum extending from a surface of either the cap or the body part about which the lever part is configured to pivot on a surface of the body part; a second hook positioned on the main part of the cap, the body part comprising a second cavity for receiving the second hook of the main part of the cap when the cap is plugged on the body part of the device, the second hook of the main part of the cap is configured to lock the cap onto the body part of the device when the second hook of the main part is positioned in the second cavity; and a first alignment element defined on a surface of one of the cap and the body part, and a second alignment element defined on a surface of the other of the cap and the body part, said alignment elements being configured to operate together for aligning the cap with the body part upon mating the cap with the body part.

Another aspect of the invention comprises a process to manufacture a cap as described above. In some embodiments the cap is produced using an injection moulding process. In some embodiments the injection moulding uses a mould comprising at least a core part (also referred to below as the ejector part) and one or more cavity parts (together making up the injection part). In some embodiments the cavity has at least two parts and one part has a protrusion that during the injection phase enters into contact with the core part of the mould. The protrusion is such that it ensures that one part of the cap (the lever) remains largely separated from the main part of the cap with the exception of a number of connecting bridges. In some embodiments there are two connecting bridges. The core part may furthermore have ejector pins or knockout pins. By properly designing the cap it is possible to produce it using an injection moulding process that uses a simple mould without needing any hydraulic sliders thus keeping the costs of the mould down.

An important advantage of the present invention is that it provides a mechanism to affix a cap to a device's body that is, on the one hand, very reliable and can withstand high pulling forces that would tend to pull the cap off of the device's body, but that, on the other hand, is very user convenient as it allows the user to quickly and easily plug the cap onto the device's body and pull it off again. The high reliability of the mechanism of the invention to affix a cap to a device's body means that it is safe for a user to hold the device on a lanyard hung around the user's neck with the lanyard fixed to the cap, without the user having to fear that the device's body (which in some cases can be highly valuable to the user because of its financial value or because of the data that it may contain) might accidentally be pulled off. Another important advantage is that a cap according to aspects of the invention can be manufactured simply and very cost effectively. Yet another advantage is that the invention allows for the device's body to be easily manufactured with standard cost effective techniques like ultrasonic welding without adversely affecting the convenience or reliability of the connection of the cap to the device's body when the cap is plugged on the device's body. Yet another advantage is that the outside of a cap according to aspects of the invention may on one side be fully unaffected by the invention's mechanism so that this side can be fully available for, e.g., decorative purposes (such as a logo). Other advantages have been described in the paragraphs above and in the following paragraphs in connection to the figures.

More advantages of the present invention will be apparent to a person skilled in the art.

BRIEF DESCRIPTION OF THE DRAWING FIGURES

FIGS. 1a-1c illustrate in three different schematic views the cap of a device according to aspects of the invention. FIG. 1a is a top plan view of the cap. FIG. 1b is a cross sectional side view of the cap shown in FIG. 1a taken along the lines B-B of FIG. 1a. FIG. 1c is a front elevation view of the cap of FIG. 1a.

FIGS. 2a-2c illustrate in three different schematic views the body of a device according to aspects of the invention. FIG. 2a is a top plan view of the device body. FIG. 2b is a cross sectional side view of the device body shown in FIG. 2a taken along the lines A-A of FIG. 2a. FIG. 2c is a front elevation view of the device body of FIG. 2a.

FIGS. 3a and 3b illustrate by means of cross sectional views the cap of FIGS. 1a-1c and the body of a device of FIGS. 2a-2c according to aspects of the invention whereby the cap is shown mounted to the device's body.

FIGS. 4a-4c illustrate in three different schematic views the cap of a device according to aspects of the invention whereby the cap's lever has an additional protrusion acting as a fulcrum. FIG. 4a is a top plan view of the cap. FIG. 4b is a cross sectional side view of the cap shown in FIG. 4a taken along the lines B-B of FIG. 4a. FIG. 4c is a front elevation view of the cap of FIG. 4a.

FIGS. 5a and 5b illustrate in two different schematic views the cap of a device according to aspects of the invention whereby the cap's lever has an additional protrusion acting as a fulcrum. FIG. 5a is a top plan view of the cap. FIG. 5b is a cross sectional side view of the cap shown in FIG. 5a taken along the lines B-B of FIG. 5a.

FIGS. 6a and 6b illustrate in two different schematic views the body of a device according to aspects of the invention whereby the device's body has an additional protrusion acting as a fulcrum. FIG. 6a is a top plan view of the device body. FIG. 6b is a cross sectional side view of the device body shown in FIG. 6a taken along the lines A-A of FIG. 6a.

FIGS. 7a and 7b illustrate in two different schematic views the cap of a device according to aspects of the invention. FIG. 7a is a cross sectional side view of the cap. FIG. 7b is a front elevation view of the cap of FIG. 7a.

FIGS. 8a and 8b illustrate in two different schematic views the body of a device according to aspects of the invention. FIG. 8a is a side view of the device body. FIG. 8b is a front elevation view of the device body of FIG. 8a.

FIGS. 9a-9c illustrate in three different schematic views the cap of a device according to aspects of the invention. FIG. 9a is a top plan view of the cap. FIG. 9b is a cross sectional side view of the cap shown in FIG. 9a taken along the lines B-B of FIG. 9a. FIG. 9c is a front elevation view of the cap of FIG. 9a.

FIGS. 10a-10c illustrate in three different schematic views the body of a device according to aspects of the invention. FIG. 10a is a top plan view of the device body. FIG. 10b is a cross sectional side view of the device body shown in FIG. 10a taken along the lines A-A of FIG. 10a. FIG. 10c is a front elevation view of the device body of FIG. 10a.

DETAILED DESCRIPTION OF THE DRAWING FIGURES

Figure 1A:
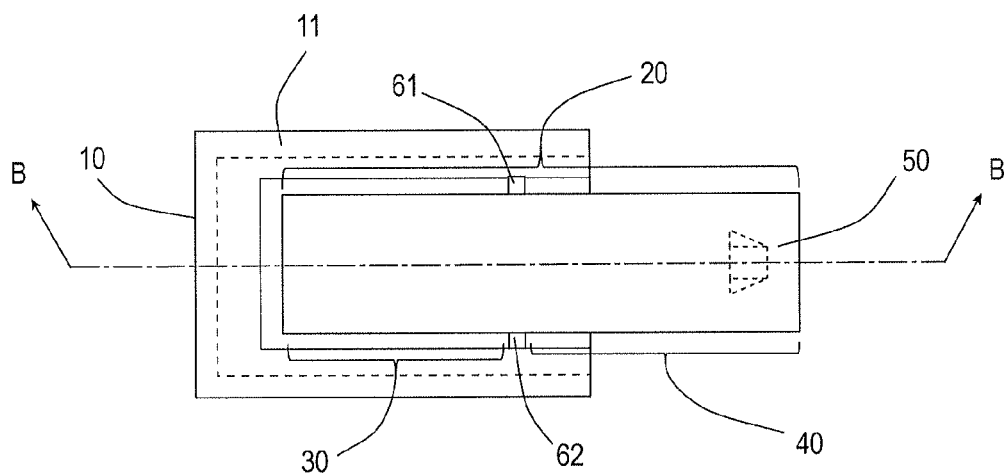

The foregoing and other features and advantages of the invention will be apparent from the following, more particular description of several embodiments of the invention, as illustrated in the accompanying drawings. Like item numbers refer to like elements in the accompanying drawings.

The following description and the annexed drawings set forth in detail certain illustrative aspects of the claimed subject matter. These aspects are indicative, however, of but a few of the various ways in which the principles of the invention may be employed and the claimed subject matter is intended to include all such aspects and their equivalents. Other advantages and novel features of the claimed subject matter will become apparent from the following detailed description of the innovation when considered in conjunction with the drawings.

The detailed description set forth below in connection with the appended drawings is intended as a description of some embodiments of the invention and is not intended to represent the only forms in which the present invention may be constructed and/or utilized. The description sets forth the functions and the sequence of steps for constructing and operating the invention in connection with the illustrated embodiments. However, it is to be understood that the same or equivalent functions and sequences may be accomplished by different embodiments that are also intended to be encompassed within the scope of the invention.

The claimed subject matter is described with reference to the drawings, wherein like reference numerals are used to refer to like elements throughout. In the following description, for purposes of explanation, numerous specific details are set forth in order to provide a thorough understanding of the invention. It may be evident, however, that the claimed subject matter may be practiced without these specific details. In other instances, well-known structures and devices are shown in block diagram form in order to facilitate describing the invention.

Figure 1B:
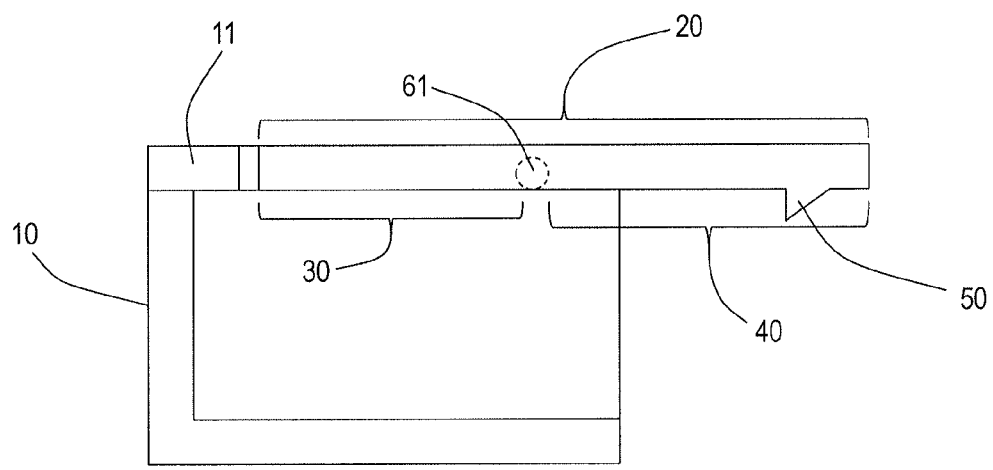
Figure 1C:
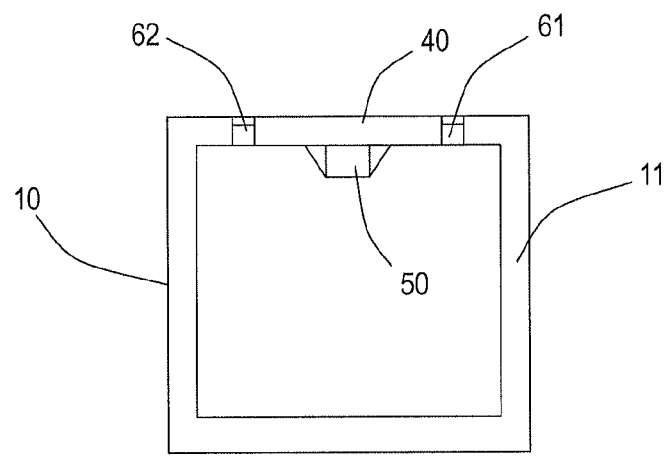

FIGS. 1a-1c are three different schematic views of the cap (10) of a device according to aspects of the invention. The device may be a USB storage device, for example. The cap (10) of FIGS. 1a-1c is configured to be releasably connected to the device body of FIGS. 2a-2c to form the assembled device shown in FIGS. 3a and 3b.

The cap (10) of FIGS. 1a-1c comprises a main part (11) and a lever part (20). The interior of the cap (10) is hollow. The lever part (20) is fixed to the main part (11) in only two discrete connection points (61, 62). Apart from these connection points (61, 62) the lever (20) is free from the remainder of the cap (10). The connection points (61, 62) define a pivot axis around which the lever (20) can pivot to some extent. The connections of the lever (20) with the main part of the cap (10) are such that when the lever (20) is made to pivot around the axis defined by the connection points (61, 62), they develop a restoring torsion that tends to push the lever (20) back to its neutral position that is illustrated in the figures. The subpart of the lever (20) on one side of the pivot axis defined by the connection points is the unlock part (30); the part on the other side of the pivot axis is the anchor part (40). The anchor part (40) has a protrusion (50) which extends downward from the lower surface of the lever (20). This protrusion (50) may also be referred to herein as the hook (50).

Figure 11:
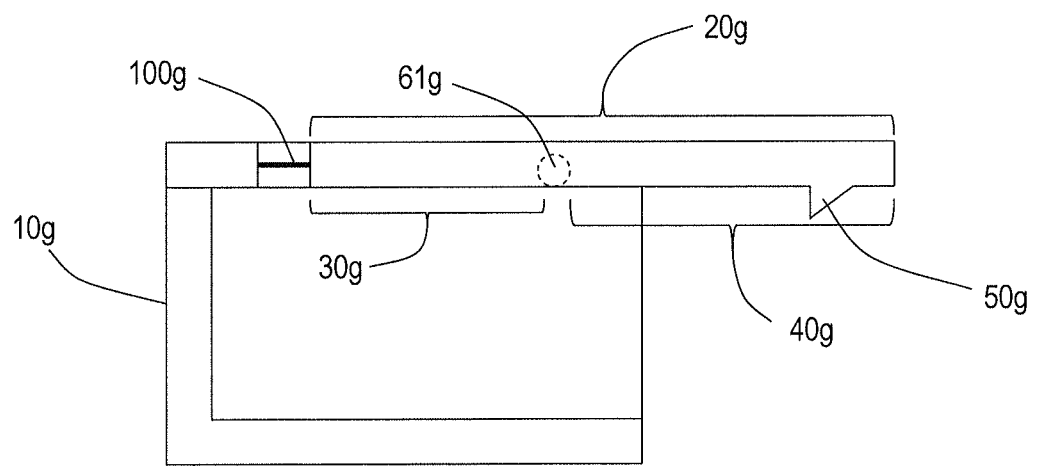
FIG. 11 is a cross sectional side view of a cap, similar to the cap of FIG. 1a, with the exception that the cap's lever is connected to the main part of the cap by means of a membrane.

In some embodiments the gap between the lever (20) and the main part of the cap (10) may be bridged, entirely or partially, by a membrane-like structure, such as shown in FIG. 11. This membrane-like structure may be elastic so as to allow the lever (20) to pivot at least to some degree around the pivot axis. In some embodiments the membrane like structure comprises a thin layer of plastic connecting the main part of the cap (10) with the lever (20). The membrane-like structure may serve in some embodiments to improve the protecting nature of the cap against, e.g., splashing water. Further details of the membrane-like structure will be described with reference to FIG. 11.

Figure 2A:
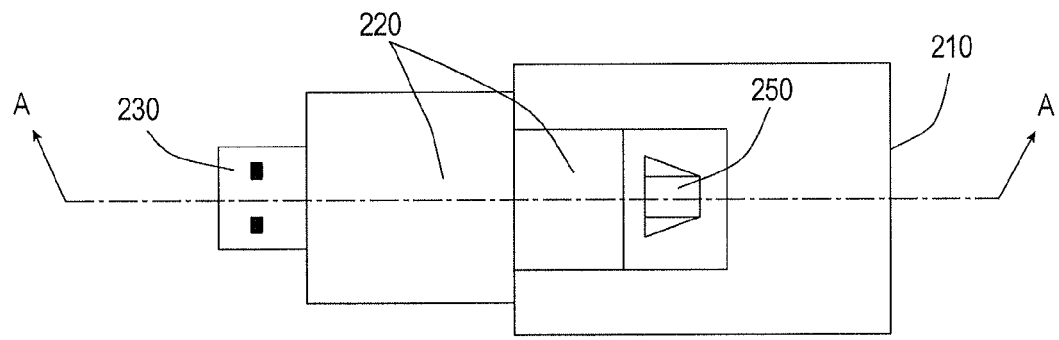
Figure 2B:
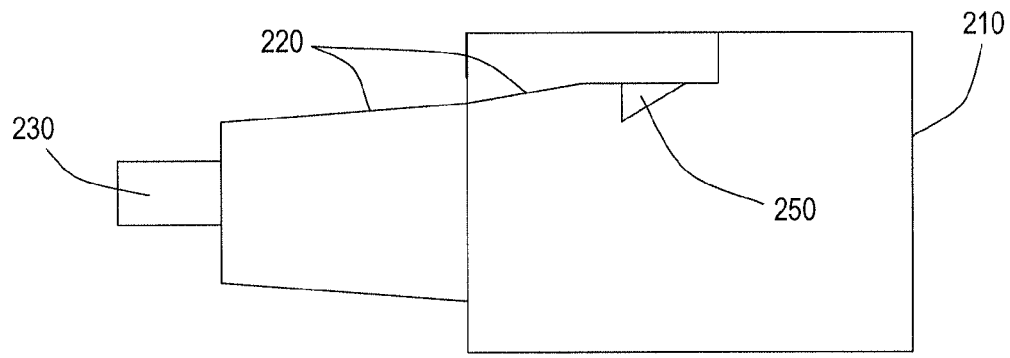
Figure 2C:
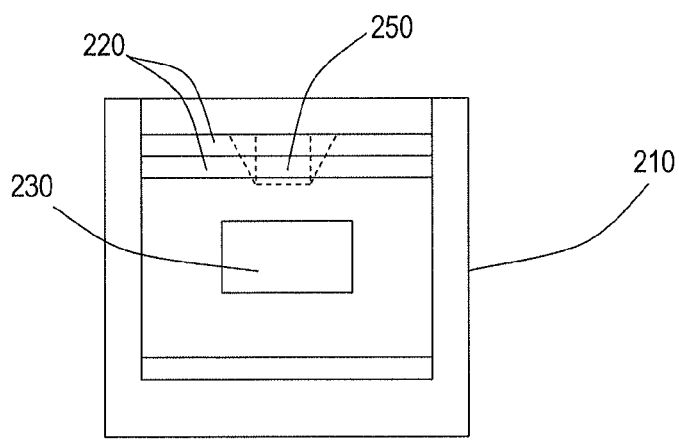

FIGS. 2a-2c are three different schematic views of the body (210) of a device according to aspects of the invention. The device's body (210) has a cavity (250) defined on its top surface that is configured to receive the hook (50) of the cap (10) of FIGS. 1a-1c when the cap (10) is plugged on the device's body (210). The device's body (210) may comprise a connector (230) for coupling the device's body (210) to a host computer (not shown) by plugging the connector (230) into a matching port of the host computer. This connector (230) may comprise a USB connector (230). The cap (10) is configured to protect connector (230) when the cap (10) is plugged onto the device's body (210). The surfaces (220) of the device's body that come into contact with the cap's (10)

hook (50) when the cap is plugged on the device's body (210) is gently sloping so as to allow an easy plugging-on of the cap (10) on the device's body (210).

Figure 3A:
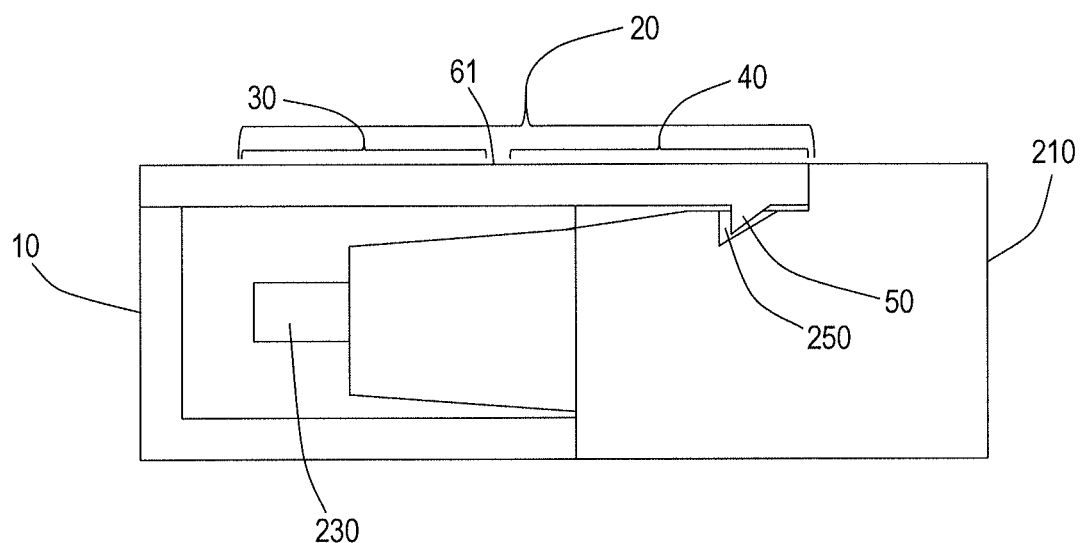
Figure 3B:
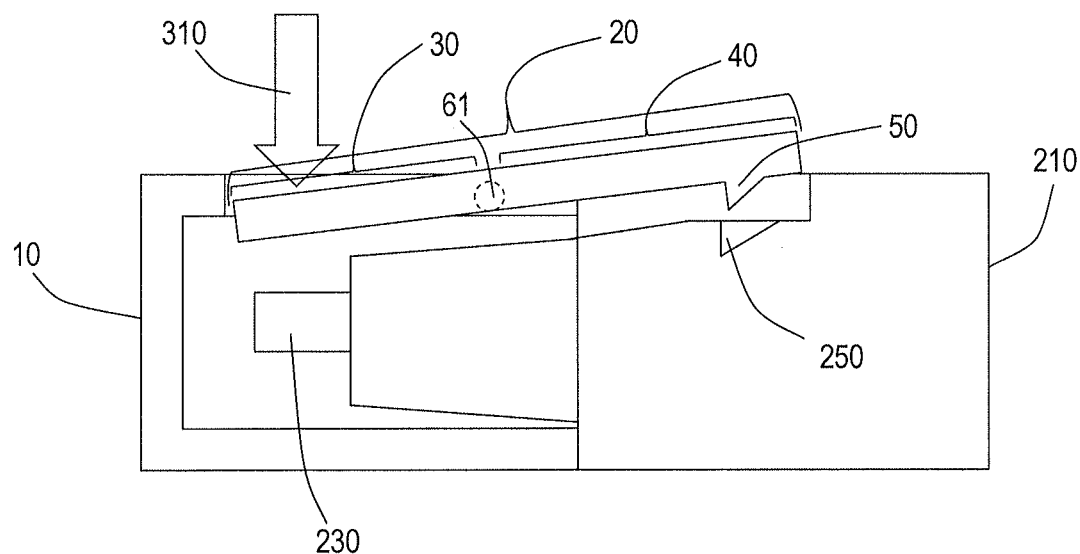

FIGS. 3a and 3b illustrate cross-sectional side views of the cap (10) of FIGS. 1a-1c mounted to the body (210) of the device of FIGS. 2a-2c, according to aspects of the invention. As is clear from FIG. 3a, if one tries to remove the cap (10) from the device's body (210) without depressing the lever's unlock part (30), the vertically extending portion of the hook (50) will come into contact with the corresponding vertical wall of the body's cavity (250). The resulting reaction force will counteract the moving of the cap (10) effectively prohibiting the cap's (10) removal. If, however, as illustrated in FIG. 3b, the user depresses the lever's (20) unlock part (30) (as symbolised by the arrow (310)), the unlock part (30) tilts inwards, the anchor (40) with the hook (50) tilts outwards, the hook (50) becomes disengaged from the cavity's (250) wall, and the cap (10) will no longer be locked onto the device's body (210) and can now be easily removed by pulling the cap (10) away from the body (210) of the device.

Figure 4A:
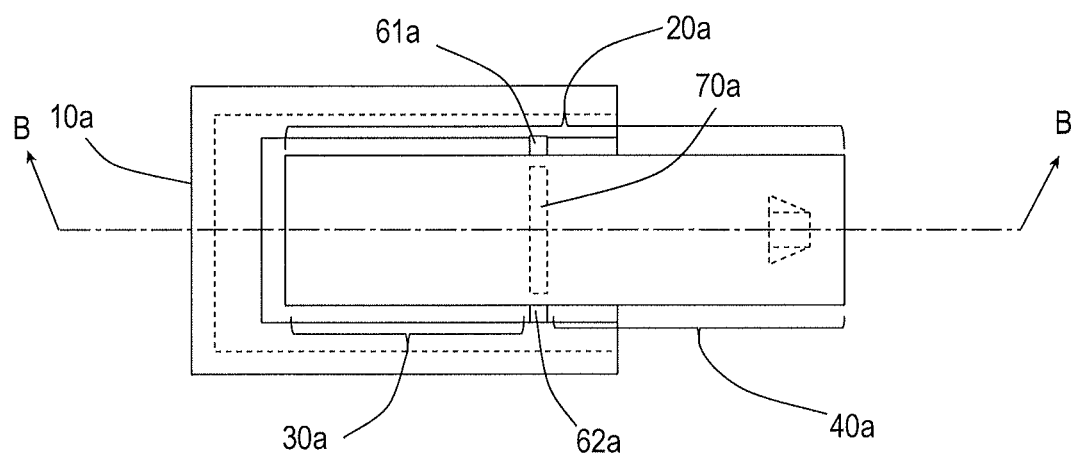
Figure 4B:
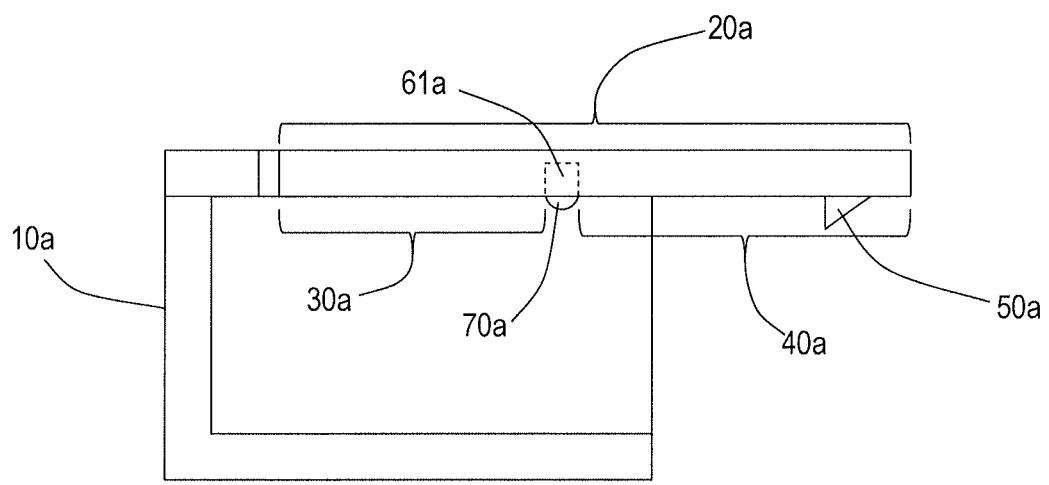
Figure 4C:
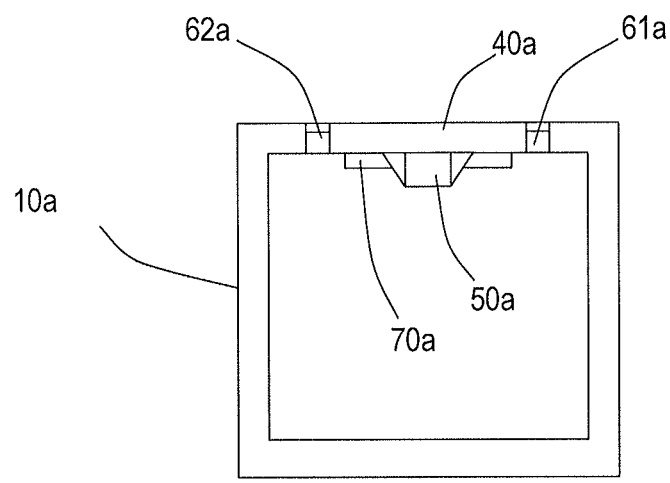

FIGS. 4a-4c are three different schematic views of a variant of the cap (10a) of a device according to aspects of the invention that is illustrated in FIGS. 1a-1c. The cap (10a) of FIGS. 4a-4c may be used with the device body (210) of FIGS. 2a-2c. In this variant of FIGS. 4a-4c the lever (20a) of the cap (10a) also comprises an extra protrusion (70a) in the vertical direction that extends in a downward vertical direction towards the device's body. The extra protrusion (70a) has the form of a ridge-like structure. When the cap is plugged on the device's body and the user pushes the unlock part (30a) of the lever, the extra protrusion (70a) may come into contact with the device's body thus acting as a fulcrum (70a) for the lever (20a). This may be particularly advantageous in those cases whereby the cap is made of relatively flexible material and the user presses the unlock part at a location that is close to the pivotal axis which, in the absence of the fulcrum (70a) could result in an overall vertical movement of the lever (20a) towards the device's body rather than into a rotation around the pivotal axis, which in turn could result in the hook (50a) not being lifted out of the device body's cavity and the cap not being unlocked. The fulcrum (70a) will in such a case ensure that the lever will pivot around the pivot axis. In some embodiments the fulcrum (70a) does not take the form of a ridge but may take the form of one or more protrusions.

Figure 5A:
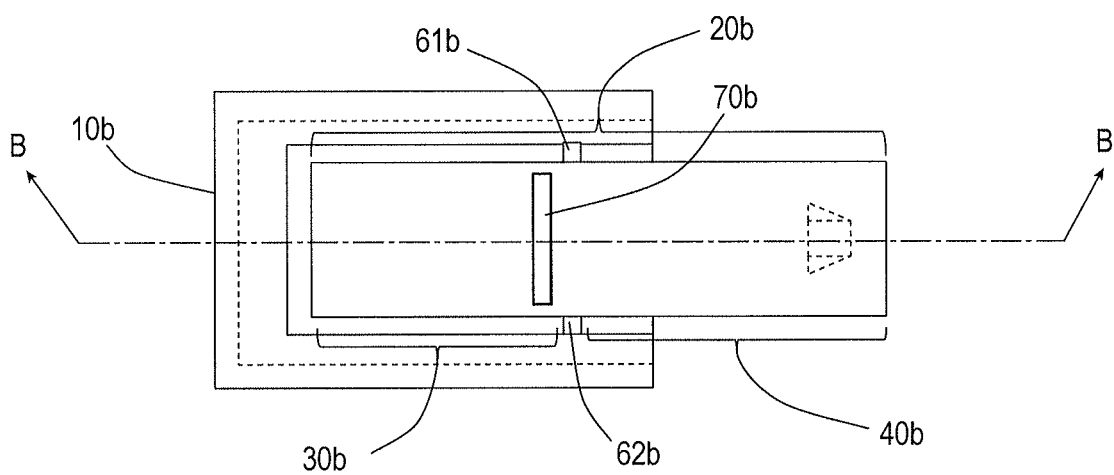
Figure 5B:
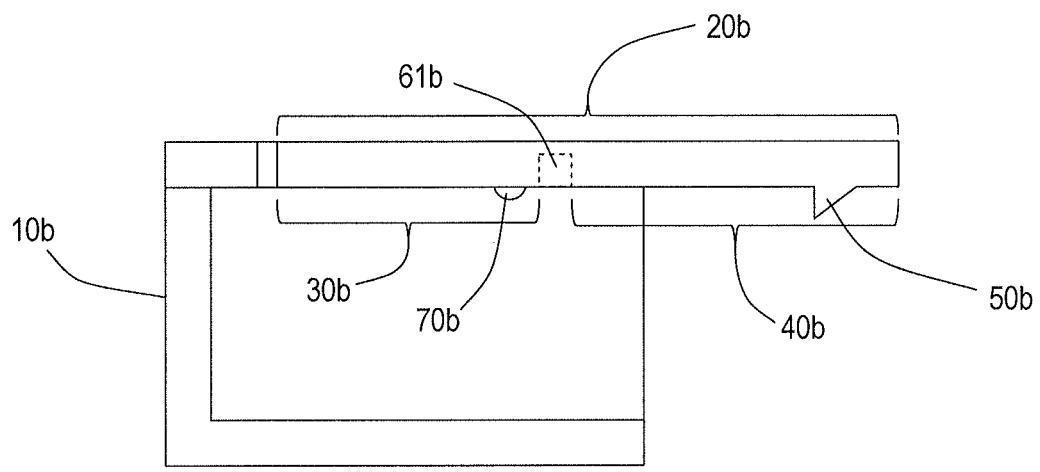

In the variant illustrated in FIGS. 5a and 5b, the fulcrum (70b) is spaced from the connection point (61b) in a direction away from the hook (50b) by a predetermined distance (e.g., 2 mm). The cap (10b) of FIGS. 5a and 5b may be used with the device body (210) of FIGS. 2a-2c. In other words, the fulcrum (70b) is spaced from the pivot axis of the lever part (20b) that is defined at the connection point (61b). The advantageous effects of this location of the fulcrum (70b) have already been described above.

Figure 6A:
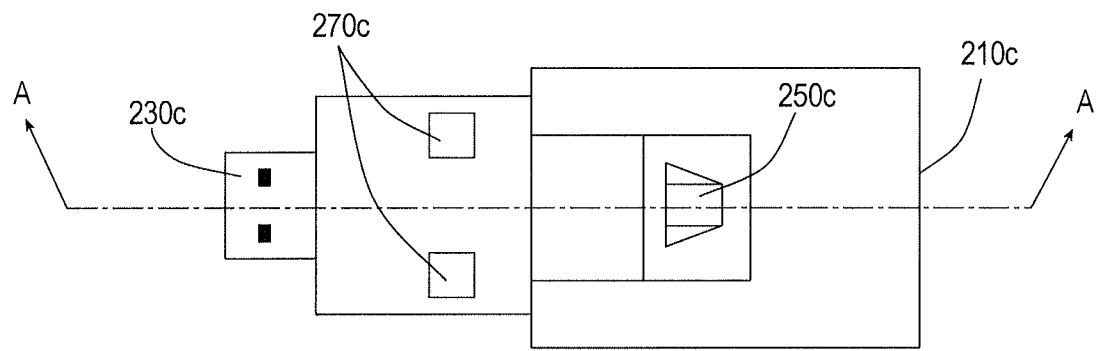
Figure 6B:
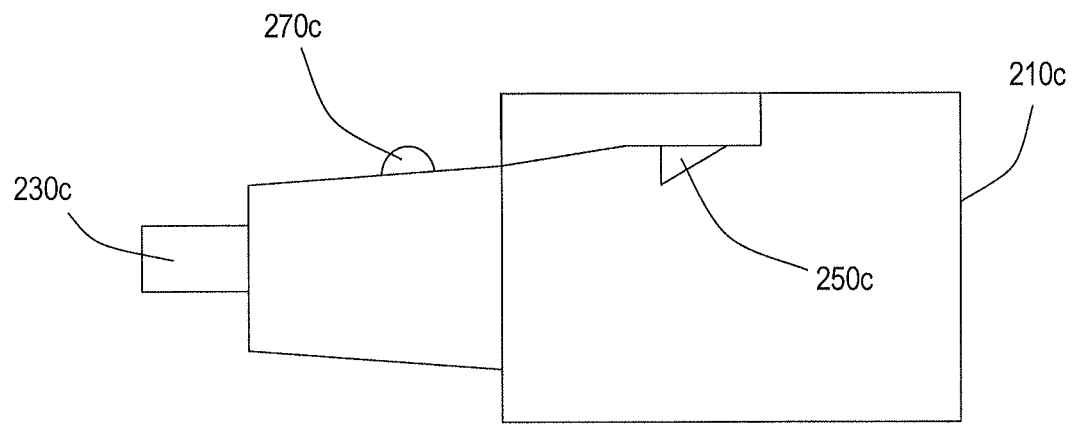

FIGS. 6a and 6b are two different schematic views of a variant of the body (210c) of a device according to aspects of the invention. The device's body (210c) is configured to be connected to the cap (10) of FIGS. 1a-1c. In this variant the device's body (210c) comprises two protrusions (270c) each of which extends upwardly in the vertical direction in order to contact the cap (10) of FIGS. 1a-1c to which the device's body (210c) is connected. The extra protrusions (270) have the form of a ridge-like structure. The protrusions (270) act as a fulcrum for the cap's (10) lever (20).

In some embodiments the position of the protrusions (270) along the plugging direction is near the pivot axis (61, 62) of the cap's (10) lever (20). In some embodiments the position of the protrusions (270) along the plugging direction is just underneath the connection points (61, 62) of the cap's (10) lever (20) when the cap (10) is plugged on the device's body (210c). In some embodiments the position of the protrusions (270) along the plugging direction is, from the view point of the hook (50), located somewhat beyond (e.g. 2 mm) the pivot axis (61, 62) of the cap's (10) lever (20) when the cap (10) is plugged on the device's body (210c).

Figure 7A:
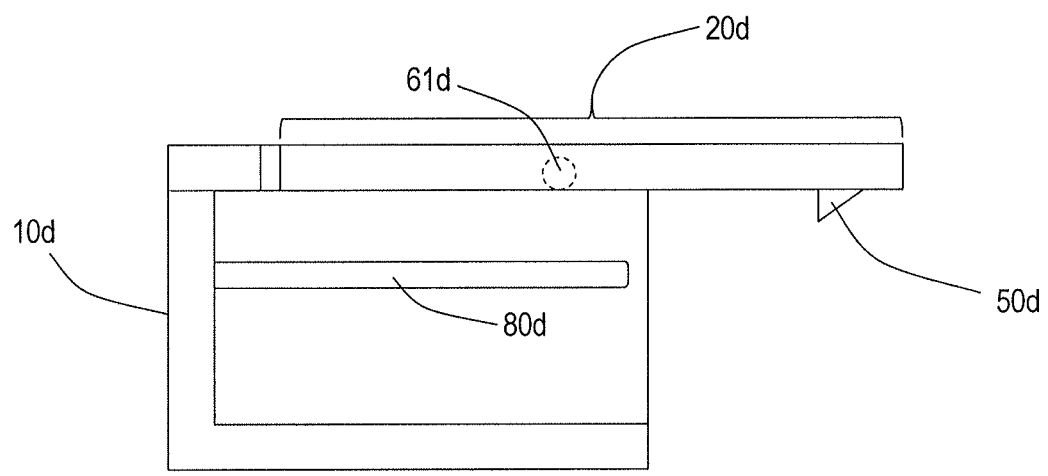
Figure 7B:
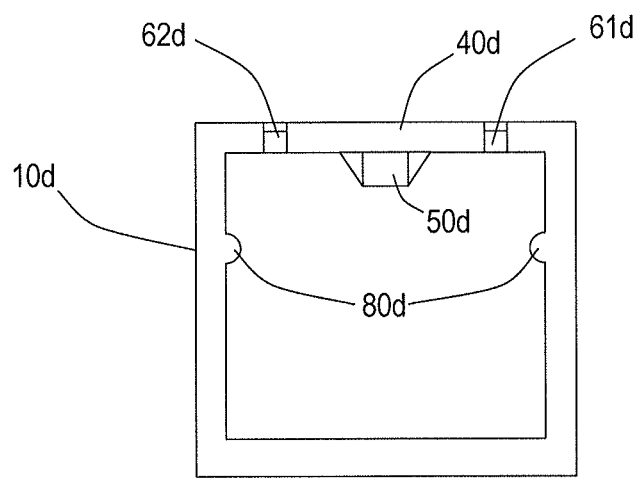
Figure 8A:
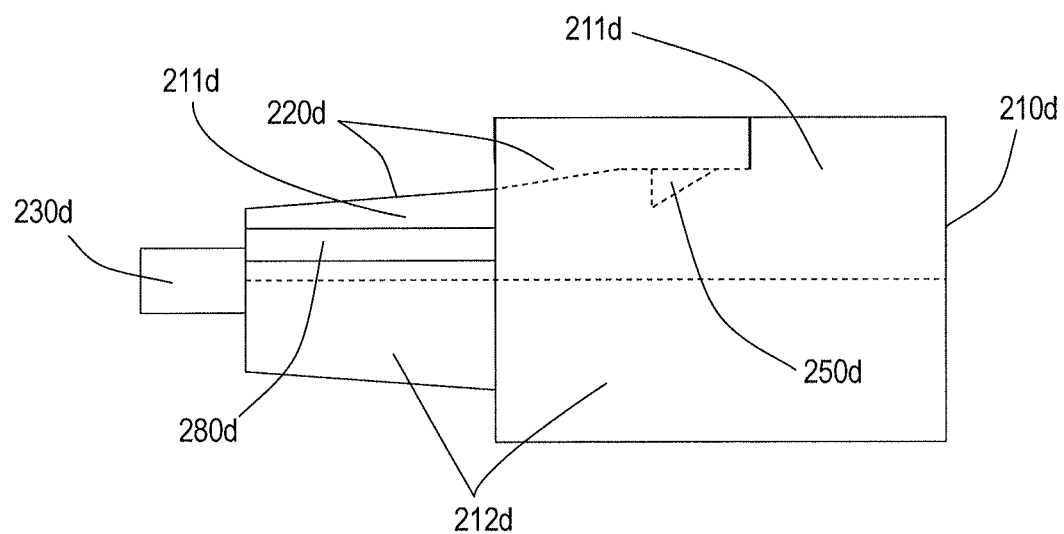
Figure 8B:
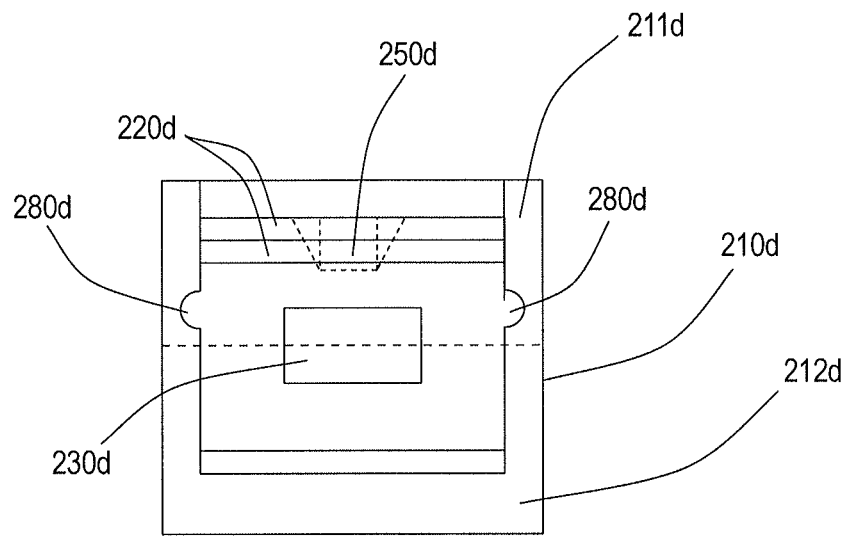

FIGS. 7a and 7b illustrate a cap (10d) according to aspects of the invention. FIGS. 8a and 8b illustrate a device body (210d) that is configured to be mated to the cap (10d) of FIGS. 7a and 7b. The cap (10d) has on its interior side walls a horizontal protruding ridge (80d) that is parallel to the direction of movement when the cap (10d) is plugged onto the device's body (210d). This ridge protruding (80d) fits into a corresponding groove (280d) that is formed on the device's body (210d). The ridge (80d) and the corresponding groove (280d) are also referred to herein as alignment elements. The combination of the cap's (10d) ridge (80d) and the body's (210d) groove (280d) ensure that the cap is vertically well positioned with respect to the top part of the device's body independently of the exact vertical position of the bottom part of the device's body. This may be advantageous in cases where the device's body comprises a top and a bottom housing part, since the good positioning of the cap on the device's body now does not depend on the accurate vertical positioning of the device body's top and bottom part. This means that a manufacturing technique having relatively large vertical tolerances, such as ultrasonic welding, can be used to assemble the top and bottom parts. Those skilled in the art will readily understand that the alignment elements may vary from that which is shown and described. For example, the horizontal protruding ridge (80d) may be provided on the device's body (210d) while the corresponding groove (280d) is provided on the cap (10d). Other alignment elements are envisioned, such as pins, slots, holes, protruding surfaces, fasteners and recesses. The body (210) of the device may comprise two or more shells, for example a top shell (211d) and a bottom shell (212d), that are assembled together to form the housing of the device's body. The alignment element (280d) of the device's body (210) may be located on the same shell (211d) on which the cavity (250d) is located. Two or more shells may be joined by ultrasonic welding.

Figure 9A:
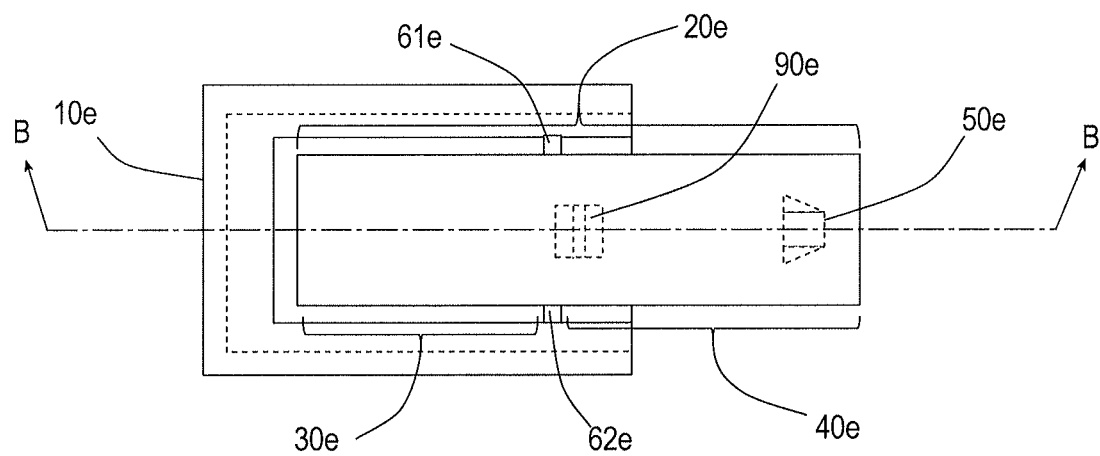
Figure 9B:
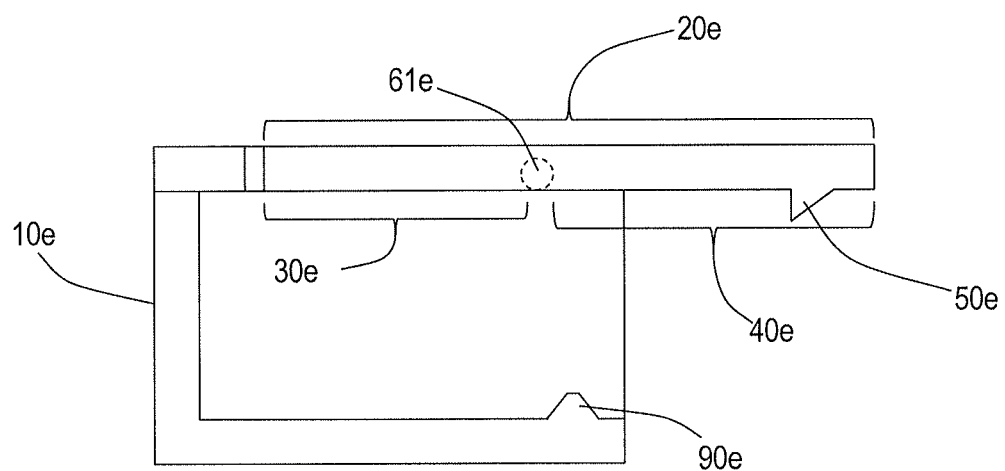
Figure 9C:
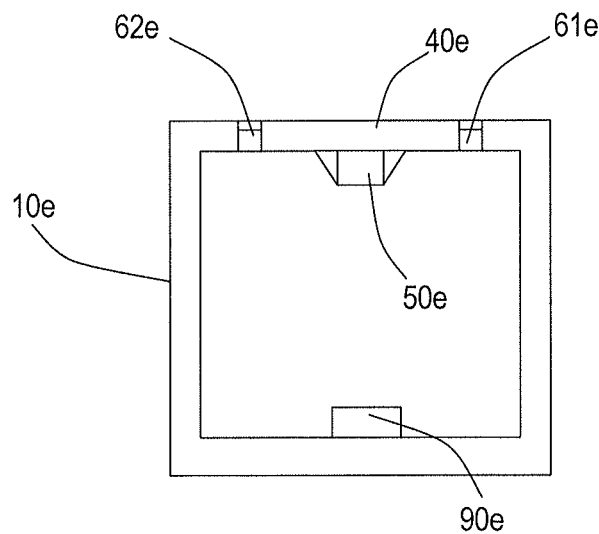

FIGS. 9a-9c illustrate a cap (10e) according to aspects of the invention whereby in addition to the hook (50e) on the anchor (40e), the cap (10e) has a second protrusion (90e) that extends in an upward vertical direction from an interior base surface of the cap (10e) toward a mating device's body (210). The second protrusion (90e) may be horizontally located between the connection point (61e) and the hook (50e), as shown in FIG. 9b. The second protrusion (90e) may also be referred to herein as the second hook of a cap.

Figure 10A:
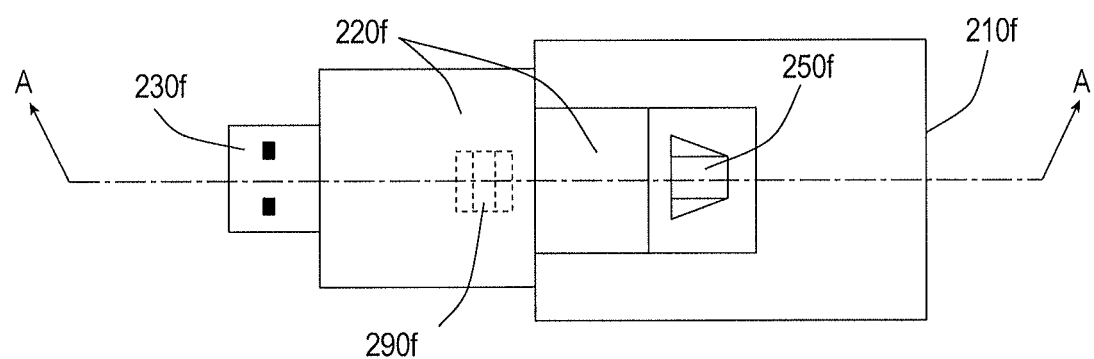
Figure 10B:
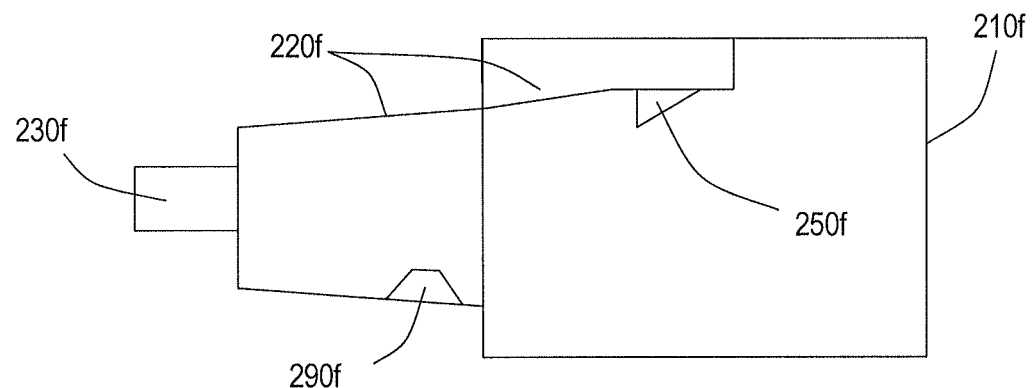
Figure 10C:
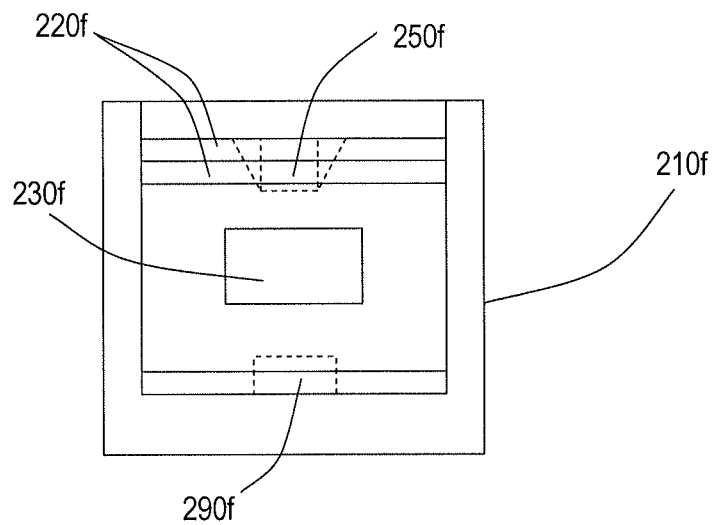

FIGS. 10a-10c illustrate the body (210f) of a device according to aspects of the invention that is configured to be releasably connected to the cap (10e) of FIGS. 9a-9c. The device's body has a second cavity (290f) to receive the cap's (10e) second protrusion (90e) when the cap is plugged on the device. The second protrusion (90e) may also be referred to herein as a second hook. The following advantages are associated to this second protrusion (90e) and second cavity (290f). When the user plugs the cap (10e) on the device's body (210f), the user will hear or feel an auditory or tactile 'click' feedback when the cap is in position. When the second protrusion (90e) has clicked into the second cavity (290f), it will together with anchor's (40e) hook (50e) ensure that no movement around the connection points (61, 62) is possible anymore even if the device's body (210f) has quite some margin with respect to the interior of the cap (10e). And if the device's body (210f) has quite some margin with respect to the interior of the cap (10e) which allows for some vertical movement of the device's body (210f) inside the cap (10e), the presence of two inwardly directed protrusions (i.e., protrusion (90e) and hook (50)) of the cap (10e) on vertically opposite sides of the cap (10) will ensure that there is always at least one protrusion that holds the cap (10) in place. In an alternative embodiment, the second protrusion (90e) is provided on the device's body (210f) and the second cavity (290f) is provided on the cap (10e) at the same locations as is shown in FIGS. 10a-10c to achieve the same result. An example of a protrusion on the device's body and a cavity on the cap is shown in FIG. 12.

In the embodiment of FIG. 11, the cap's (10g) lever (20g) is connected to the main part of the cap (10g) by means of a membrane (100g). This membrane or membrane-like structure (100g) closes the opening gap between the lever (20g) and the main part of the cap (10g) thus improving the capacity of the cap (10g) to protect the connector (230) of the device's body (210) against, e.g., splashing water. In some embodiments the membrane (100g) is highly elastic to ensure that the lever (20g) can still be pivoted when the user presses the unlock part (30g) to unlock the cap (10g).

Figure 12:
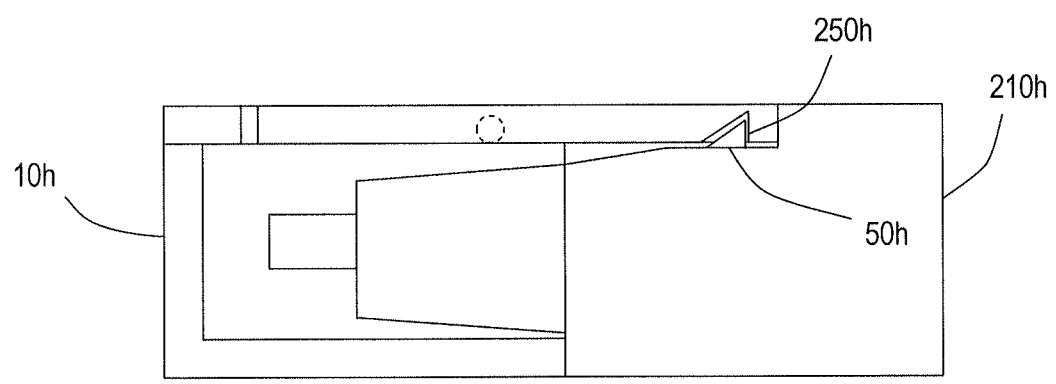
FIG. 12 is a cross sectional side view of a cap, similar to the cap of FIG. 3a, with the exception that the hook is provided on the device's body and the cavity, which mates with the hook, is provided on the cap.

The assembled device embodiment of FIG. 12 is substantially similar to the device embodiment of FIG. 3a, with the exception that the hook (50h) is provided on the device's body (210h) and the mating cavity (250h) is provided on the cap (10h).

A number of implementations have been described. Nevertheless, it will be understood that various modifications may be made. For example, elements of one or more implementations may be combined, deleted, modified, or supplemented to form further implementations. Accordingly, other implementations are within the scope of the appended claims.

In addition, while a particular feature of the present invention may have been disclosed with respect to only one of several implementations, such feature may be combined with one or more other features of the other implementations as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

While various embodiments of the present invention have been described above, it should be understood that they have been presented by way of example only, and not limitation. In particular, it is, of course, not possible to describe every conceivable combination of components or methodologies for purposes of describing the claimed subject matter, but one of ordinary skill in the art may recognize that many further combinations and permutations of the present invention are possible. Thus, the breadth and scope of the present invention should not be limited by any of the above described exemplary embodiments but should be defined only in accordance with the following claims and their equivalents.

What is claimed:

1. An electronic device comprising a body part and a cap that is removably connected to the body part, the body part comprising a connector for plugging the device into a host computing device, said connector being concealed by the cap when the cap is connected to the body part, the cap comprising a lever part and a main part, the lever part of the cap being attached to the main part, the lever part being able to pivot at least partially around a pivot axis with respect to the main part, the lever part comprising an anchor part on one side of the pivot axis and an unlock part on the other side of the pivot axis, the anchor part of the cap comprising one of a first hook and a first cavity, the body part comprising the other of the first hook and the first cavity, said first cavity for receiving the first hook when the cap is plugged on the body part of the device, the first hook being configured to lock the cap onto the body part of the device when the first hook is positioned in the first cavity, the unlock part being configured to be depressed by a user of the device to cause the lever to pivot around the pivot axis thereby disengaging the first hook from the first cavity so that the cap can be released from the body part of the device.

2. The electronic device of claim 1, further comprising a fulcrum extending from a surface of either the cap or the body part about which the lever part is configured to pivot.

3. The electronic device of claim 2, wherein a longitudinal axis of the fulcrum is spaced by a predetermined distance from a pivot axis of the lever part.

4. The electronic device of claim 3, wherein the anchor part of the cap comprises the first hook and the fulcrum is positioned on an opposite side of the pivot axis as the first hook, wherein, upon mounting the cap to the body part, the fulcrum contacts the body part which causes the first hook to pivot into the first cavity.

5. The electronic device of claim 1, further comprising one of a second hook and a second cavity positioned on the main part of the cap, the body part comprising the other of the second hook and the second cavity, said second cavity for receiving the second hook when the cap is plugged on the body part of the device, the second hook being configured to lock the cap onto the body part of the device when the second hook is positioned in the second cavity.

6. The electronic device of claim 1 further comprising a first alignment element defined on a surface of one of the cap and the body part, and a second alignment element defined on a surface of the other of the cap and the body part, said alignment elements being configured to operate together for aligning the cap with the body part upon mating the cap with the body part.

7. The electronic device of claim 6, wherein the body part comprises a plurality of shell parts that are joined together, and wherein the alignment element that is defined on the body part resides on the same shell part of the body part as the other of the first hook and the first cavity that is comprised on the body part.

8. The electronic device of claim 7, wherein at least two shell parts have been joined by ultrasonic welding.

9. The electronic device of claim 6, wherein the first alignment element is a protruding ridge and the second alignment element is a groove that is configured to receive the protruding ridge.

10. The electronic device of claim 6 wherein the first and second alignment elements are configured to restrict the movement of the cap with respect to the body part along a direction perpendicular to the lever's pivot axis when the cap has been plugged onto the device's body part.

11. The electronic device of claim 10 wherein the first and second alignment elements are configured to restrict the movement of the cap with respect to the body part along a direction perpendicular to the direction of movement when the cap is being plugged onto the device's body part.

12. The electronic device of claim 1, wherein the connector of the body part comprises a USB connector.

13. The electronic device of claim 12, wherein the first cavity is located on the USB connector.

14. The electronic device of claim 1, wherein a gap is defined between the lever part and the main part of the cap, and wherein an elastic membrane is positioned in a portion of the gap.

15. A USB device comprising a body part and a cap that is removably connected to the body part, the body part comprising a USB connector for plugging the device into a host computing device, said connector being concealed by the cap when the cap is connected to the body part, the cap comprising a lever part and a main part, the lever part of the cap being attached to the main part, the lever part being able to pivot at least partially around a pivot axis with respect to the main part, the lever part comprising an anchor part on one side of the pivot axis and an unlock part on the other side of the pivot axis, the anchor part of the cap comprising one of a first hook and a first cavity, the body part comprising the other of the first hook and the first cavity, said first cavity for receiving the first hook when the cap is plugged on the body part of the device, the first hook being configured to lock the cap onto the body part of the device when the first hook is positioned in the first cavity, the unlock part being configured to be depressed by a user of the device to cause the lever to pivot around the pivot axis thereby disengaging the first hook from the first cavity so that the cap can be released from the body part of the device;

- a fulcrum extending from a surface of either the cap or the body part about which the lever part is configured to pivot on a surface of the body part;
- a second hook positioned on the main part of the cap, the body part comprising a second cavity for receiving the second hook of the main part of the cap when the cap is plugged on the body part of the device, the second hook of the main part of the cap is configured to lock the cap onto the body part of the device when the second hook of the main part is positioned in the second cavity; and
- a first alignment element defined on a surface of one of the cap and the body part, and a second alignment element defined on a surface of the other of the cap and the body part, said alignment elements being configured to operate together for aligning the cap with the body part upon mating the cap with the body part.

* * * * *